United States Patent [19]

Kishimura et al.

[11] Patent Number: 5,217,851
[45] Date of Patent: Jun. 8, 1993

[54] PATTERN FORMING METHOD CAPABLE OF PROVIDING AN EXCELLENT PATTERN OF HIGH RESOLUTION POWER AND HIGH SENSITIVITY

[75] Inventors: Shinji Kishimura; Akemi Fukui, both of Hyogo, Japan

[73] Assignee: Mitsubishi Denki Kabushiki Kaisha, Tokyo, Japan

[21] Appl. No.: 773,743

[22] Filed: Oct. 10, 1991

Related U.S. Application Data

[63] Continuation-in-part of Ser. No. 500,970, Mar. 29, 1990, abandoned.

[30] Foreign Application Priority Data

Sep. 5, 1989 [JP] Japan .................................. 1-229499

[51] Int. Cl.$^5$ ............................ G03C 5/16; G03C 1/72
[52] U.S. Cl. ..................................... 430/325; 430/192; 430/311; 430/313; 430/326; 430/330
[58] Field of Search ............... 430/313, 325, 326, 311, 430/192, 330, 322, 18

[56] References Cited

U.S. PATENT DOCUMENTS

| | | | |
|---|---|---|---|
| 3,859,091 | 1/1975 | Wessells et al. | 430/327 |
| 4,552,833 | 11/1985 | Ito et al. | 430/325 |
| 4,613,398 | 9/1986 | Chiong et al. | 430/325 |
| 4,751,170 | 6/1988 | Mimura et al. | 430/323 |
| 4,810,601 | 3/1989 | Allen et al. | 430/311 |
| 5,023,164 | 6/1991 | Brunsvold et al. | 430/326 |
| 5,123,998 | 6/1992 | Kishimura | 156/643 |

FOREIGN PATENT DOCUMENTS

| | | |
|---|---|---|
| 0281182 | 2/1988 | European Pat. Off. . |
| 62-273528 | 11/1987 | Japan . |
| 63-071843 | 4/1988 | Japan . |
| 63-187237 | 8/1988 | Japan . |

OTHER PUBLICATIONS

Kodak Publ, (G-47, Proc. Microelectronic Seminar. Interface '76, 1976), 116-22.
Article "Silylation Method—Feature and Evaluation of the Same—" Semicon News (Nov. 1988), pp. 84-91.
F. Coopmans and B. Roland "Desire: A Novel Dry Developed Resist System", SPIE vol. 631 Advances in Resist Technology and Processing III (1986), pp. 34-39.

*Primary Examiner*—Charles L. Bowers, Jr.
*Assistant Examiner*—Thorl Chea
*Attorney, Agent, or Firm*—Lowe, Price, LeBlanc & Becker

[57] ABSTRACT

A pattern forming method providing a satisfactory pattern shape of high resolution power and high sensitivity. A pattern forming material comprising a resin containing hydroxyl groups is coated on a substrate and selectively exposed by Deep UV light using an optional mask. Then, the surface of the unexposed area is selectively silylated by hexamethyl disilazane and, thereafter dry-developed by reactive ion etching using $O_2$ gas. With such a constitution, the exposed area and the unexposed area can be distinguished clearly to obtain a resist pattern of high resolution power. Further, since the Deep UV light has a property of being strongly absorbed to the resist film, the sensitivity is increased. Further, since the Deep UV light does not reach as far as the lower portion of the resist film, no undesirable notching phenomenon occurs even if there is any step on the substrate to be fabricated. Likewise, if any light reflective film such as an Al film is present on the substrate, the pattern shape is free from the effect of the film.

11 Claims, 7 Drawing Sheets

PATTERN FORMING METHOD CAPABLE OF PROVIDING AN EXCELLENT PATTERN OF HIGH RESOLUTION POWER AND HIGH SENSITIVITY

This application is a continuation-in-part of application Ser. No. 07/500,970 filed Mar. 29, 1990, abandoned.

BACKGROUND OF THE INVENTION

1. Field of the Invention

The present invention concerns generally a pattern forming method and, more in particular, it relates to a pattern forming method improved such that a satisfactory pattern shape of high resolution power and high sensitivity can be obtained.

2. Description of the Background Art

At present, large scaled integrated circuits (LSI) typically represented by 1M and 4M dynamic random access memories (DRAM) have been prepared by selectively exposing positive photoresist comprising a novolak resin and naphthoquinone diazide to g-ray light from a mercury lamp (436 nm wavelength) and then forming a pattern. The minimum pattern size is from 1 μm to 0.8 μm. However, since it is expected that the degree of integration for LSI will be increased more and more, for example, as seen in 16 MDRAM, a method of forming a pattern by the order of one-half micron size will be required. In view of the above, a pattern forming method using, as an optical source, a KrF excimer laser which is a shorter wavelength optical source has been studied at present.

As photoresist material used for Deep UV light typically represented by the KrF excimer laser, there has been proposed positive photoresist of novolak-naphthoquinone diazide type such as PR 1024 (products manufactured by McDarmid Co.), polymethyl methacrylate (PMMA), polyglycidyl methacrylate (PGMA), polychloromethylated styrene (CMS), etc. PMMA and PGMA show low sensitivity and poor dry etching resistance. CMS has good dry etching resistance but shows low sensitivity. PR 1024 has good dry etching resistance and higher sensitivity as compared with that of the above-mentioned photoresist but its sensitivity is low as compared with by g-ray exposure.

Explanation will then be made for a conventional pattern forming method.

FIGS. 6A–6C are cross sectional views for illustrating a conventional pattern forming method using novolak-naphthoquinone diazide type positive resist material (for example, PR 1024).

As shown in FIG. 6A, PR 1024 is coated on a substrate 2 to be fabricated and then pre-baked to obtain a resist film 1 of 1.0 μm film thickness.

Then as shown in FIG. 6B, KrF excimer laser beam 4 is selectively irradiated to the resist film 1 using a mask 5. Thus, the resist film is partitioned into an exposed area 1a and an unexpected area 1b.

Then, as shown in FIG. 6C, development is carried out by using an aqueous 2.38 wt % solution of tetramethyl ammonium hydroxide to obtain a resist pattern 9 in which an exposed area 1a is removed. In the conventional resist pattern forming method having thus been constituted, there are the following problems.

Since the novolak-naphquinone diazide type positive resist such as PR1024 shows great absorption to Deep UV light, light absorption is remarkable at the surface of the resist film and the light can not reach as far as the lower portion of the resist film 1. As a result, a resist pattern 9 has an upwardly pointed trigonal cross sectional shape as shown in FIG. 6C, failing to obtain a fine pattern at good accuracy.

Further, in the conventional pattern forming method using not Deep UV light at a wavelength of 300–500 nm, if the substrate 2 to be fabricated has a step 2a as shown in FIG. 7, light 20 is scattered at the step 2a failing to obtain a satisfactory pattern shape (this is referred to as a notching phenomenon). If a light reflective film such as an Al film is formed on the fabricated substrate 2, there is also a problem that no satisfactory pattern shape can be obtained due to the effect of the reflection light.

FIGS. 8A–8D show another example of conventional resist pattern forming method described in Japanese Patent Laid-Open No. 63-253356.

As shown in FIG. 8A, a resist film of novolak-naphthoquinone diazide type is formed on a substrate 2 to be fabricated. Then, light at 300–500 nm wavelength emitted from a high pressure mercury lamp is selectively irradiated on the resist film 1 by using a mask 5. By the exposure of the light, crosslinking reaction of the resin occurs in the exposed area 1a.

Then as shown in FIG. 8B, by exposure of light of an identical wavelength to the entire surface of the resist film 1, photosensitive agent is completely decomposed.

Subsequently, as shown in FIG. 8C, vapors of trimethyl silyldimethylamine are acted on the entire surface of the substrate 2. This causes selective silylation to a portion excepting for the exposed area 1a, that is, to the upper portion of an unexposed area 1b to convert the portion into a silylated layer 8. Then, as shown in FIG. 8D, when development is carried out by reactive ion etching (RIE) using O₂ gas, the silylated layer 5 remains in the form of a SiO₂ layer 13, while the exposed area 1a is removed, to thereby form a resist pattern 9 on the substrate 2.

However, in this conventional example having thus been constituted, since light at 300–500 nm length has been used, no sufficient crosslinking is conducted for the resin as shown in FIG. 8A. As a result, selectivity of the silylation (ratio between the silylating reaction in the upper portion of the exposed area 1a and the silylating reaction in the upper layer portion of the unexposed area 1b) is low as shown in FIG. 8C. This leads to a problem that the boundary between the exposed area and the unexposed area is not distinctive, failing to obtain a fine pattern at high accuracy as shown in FIG. 8D. Further, this method also involves a problem of the notching effect as described above referring to FIG. 7.

SUMMARY OF THE INVENTION

It is accordingly, an object of the present invention to provide an improved pattern forming method capable obtaining a satisfactory pattern shape of high resolution power and high sensitivity.

Another object of the present invention is to provide a pattern forming method capable of obtaining a satisfactory pattern shape by making a clear distinction between an exposed area and an unexposed area.

A further object of the present invention is to provide a pattern forming method capable of obtaining a pattern of a satisfactory shape even when a step is present on a substrate to be fabricated.

A further object of the present invention is to provide a pattern forming method capable of obtaining a pattern of a satisfactory shape even when a light reflective film such as an Al film is present on the substrate to be fabricated.

A further object of the present invention is to provide an improved pattern forming method capable of obtaining a satisfactory pattern of high resolution power and high sensitivity by using a general purpose resist material and general purpose apparatus.

A further object of the present invention is to provide a pattern forming method than can be applied to the production of large scaled integrated circuits having high degree of integration.

A further object of the present invention is to provide an improved pattern forming method capable of obtaining a satisfactory pattern shape of high resolution power and high sensitivity by using Deep UV light.

A still further object of the present invention is to provide a pattern forming method capable of obtaining a satisfactory pattern shape by forming an $SiO_2$ film with good selectivity on the upper portion of an unexposed area thereby making clear distinction between the exposed area and the unexposed area.

For attaining the foregoing objects, in the pattern forming method in accordance with the first aspect of the present invention, a pattern forming material containing a resin having a hydroxyl group is at first coated on a substrate for forming a resin film containing hydroxyl groups on the substrate. Then, Deep UV light at a wavelength of 190 to 300 nm is irradiated selectively to the hydroxyl-containing resin film by using an optional mask, thereby partitioning the resin film into an exposed area and an unexposed area. Subsequently, the resin film is treated with a silylating agent for silylating the surface of the unexposed area of the resin film. Then, for selectively removing the exposed area of the resin film, the resin film was developed by $O_2$ gas plasma.

In the first aspect of the present invention, it is preferred to wet the surface of the resin film with a liquid of the same sililating agent as that described above for improving the affinity the resin film and the silylating agent, prior to silylating of the surface of the unexposed area of the resin film. Further, instead of wetting the surface of the resin film with the silylating agent, the surface of the resin film may be exposed to vapors of the same silylating agent as that mentioned above.

In the pattern forming method in accordance with the second aspect of the present invention, a pattern forming material comprising a resin containing hydroxyl groups and/or carboxyl groups and a photosensitive agent forming carboxyl groups under light irradiation is coated on a substrate, thereby forming a resin film of the pattern forming material on the substrate. Then, a first light having such a wavelength as forming carboxyl groups from the photosensitive agent is applied to the entire surface of the resin film. Then, a second light having such a wavelength as causing crosslinking in the resin film is selectively applied to the resin film by using an optional mask thereby partitioning the resin film into an area exposed to the second light and an area not exposed to the second light. Then, for silylating the surface of the second light unexposed area, the resin film is treated with a silylating agent. Subsequently, for selectively removing the second light exposed area, the resin film is developed with $O_2$ gas plasma.

In the second aspect of the present invention, it is preferred to use Deep UV light at a wavelength of 190 to 300 nm as the second light.

According to the first aspect of the present invention, Deep UV light at a wavelength of 190 to 300 nm is selectively applied to a resin film containing hydroxyl groups by using an optional mask. Since the Deep UV light has high energy, it efficiently brings about crosslinking reaction shown in FIG. 2A. Accordingly, the concentration of the hydroxyl groups is remarkably reduced in the upper portion of the exposed area.

When the silylating agent is acted on the resin film in such a state, since the concentration of the hydroxyl groups is low in the upper portion of the exposed area, silylating reaction shown in FIG. 2B scarcely occurs. On the other hand, since the concentration of the hydroxyl groups is maintained at the initial state in the upper portion of the unexposed area, the concentration of the hydroxyl groups is high. Accordingly, the silylating reaction shown in FIG. 2B occurs in the upper portion of the unexposed area.

After all, the silylating reaction occurs preferentially to the portion not exposed to with the Deep UV light. In other words, silylating reaction is taken place selectively. The silylated portion is converted into an $SiO_2$ film by $O_2$ gas plasma. Since the $SiO_2$ film forms an effective shielding material for the $O_2$ gas plasma, not silylated portion, that is, the exposed area is preferentially removed by the development with $O_2$ gas plasma. That is, clear distinction is made between the exposed area and the unexpected area. As a result, a resist pattern of high resolution power can be obtained.

Further, Deep UV light is used as the pattern forming light and, since the Deep UV light has a property of been strongly absorbed to the resist, it has an effect of increasing the sensitivity.

Furthermore, since the Deep UV light has a property 10 of being strongly absorbed to the resist, crosslinking reaction occurs only at the surface portion of the resist film and the light does not reach as far as the lower portion. Therefore, if a step is present in the substrate to be fabricated, no notching phenomenon is caused. Likewise, if light reflective film such as an Al film is present on the substrate, the pattern shape is free from the effect of reflection.

According to the second aspect of the present invention, a first light having a wavelength capable of forming carboxyl groups from the photosensitive material is applied to the entire surface of the resin film prior to the step of crosslinking the resin film by the exposure of the second light. By the exposure of the first light, the photosensitive material, for example, naphthoquinone diazide type is decomposed as shown below to form carboxyl groups.

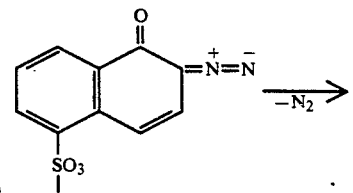

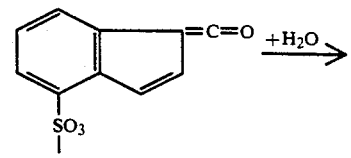

-continued

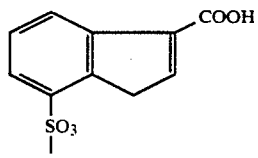

By previously decomposing the photosensitive material, the crosslinking density of the resin in the exposed area is increased in the next step for the exposure of the second light. Increase in the crosslinking density results in, in other words, reduction of the concentration of the carboxyl groups and the hydroxyl groups in the exposed area.

When the silylating agent is acted on the resin film in such a state, since the concentration of the hydroxyl groups and the carboxyl groups is low in the upper portion of the exposed area, the silylating reaction shown in FIG. 2B scarcely occurs. On the other hand, since the hydroxyl groups and the carboxyl groups of the photosensitive material remain unreacted in the upper portion of the unexposed area, their concentrations are high. Therefore, both of the silylating reaction shown in FIG. 2B and the silylating reaction of the carboxyl groups of the photosensitive material occur in the upper portion of the unexposed area. In this case, the density of silylation is increased by so much as the concentration of the carboxyl group of the photosensitive material as compared with the case of using only the resin. After all, the silylating reaction occurs preferentially to a portion not exposed to the second light. In other words, there is a selectivity in the silylating reaction.

The silylated portion is converted into an $SiO_2$ film by $O_2$ gas plasma. Since the $SiO_2$ film is an effective shielding material for $O_2$ gas plasma, not silylated portion, that is, the exposed area is preferentially removed by the development with $O_2$ gas plasma. That is, there is a clear distinction between the exposed area and the unexposed area. As a result, a resist pattern of high resolution power can be obtained.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1A:
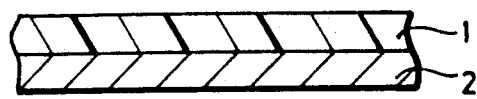
FIGS. 1A to 1E are cross-sectional views illustrating the steps of one example according to the present invention.

This invention is to be explained by way of preferred examples referring to the drawings.

FIG. 1A-1E are cross sectional views illustrating the steps of an example according to the present invention.

As shown in FIG. 1A, a solution of a p-vinylphenol/2-hydroxyethyl methacrylate (1:1) copolymer (Mw=10,000) in 1-acetoxy-2-ethoxyyethane was rotationally coated on a substrate 2 to be fabricated. Then, it was pre-baked on a hot plate at 110° C. for 70 sec to obtain a resist film 1 of 1.2 μm film thickness.

Figure 1B:
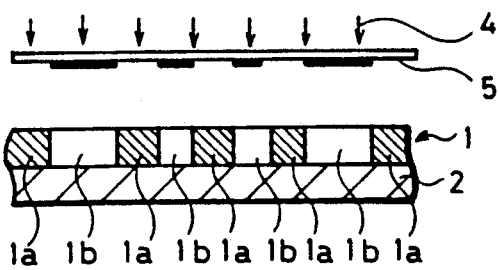

Then, as shown in FIG. 1B, KrF excimer laser beam 4 (at 248 nm wavelength) was applied selectively to the resist film by using a mask 5. By the selective exposure of the KrF excimer laser beam 4, the resist film 1 was partitioned into an exposed area 1a and an unexposed area 1b. In the exposed area 1a, crosslinking reaction shown in FIG. 2A occurred by which the concentration of the hydroxyl groups was reduced.

Figure 1C:
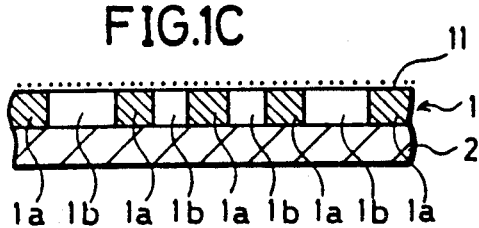

Then, as shown in FIG. 1C, a solution 11 of hexamethyl disilazane (hereinafter referred to as HMDS) was rotationally coated on the resist film 1 as a pretreatment. The HMDS solution 11 was rotationally coated on the resist film 1 for increasing the affinity between HMDS and the resist film 1 thereby smoothly proceeding the silylating reaction in the subsequent step. The HMDS solution 11 was rotationally coated on the resist film 1 in this example but the surface of the resist film 1 may be exposed to the vapor of HMDS alternatively. The pretreatment is carried out on the hot plate at a temperature of 80°C.-100° C. for 60-120 seconds under atmospheric pressure.

Figure 1D:
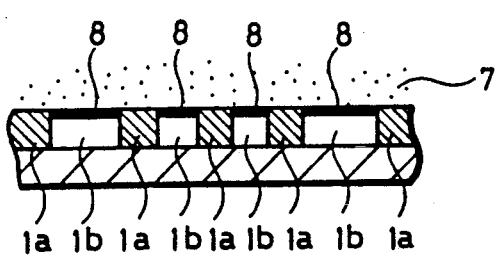

Then, as shown in FIG. 1D, the thus treated substrate 2 was introduced into a vacuum oven and put to silylating reaction at a temperature of 160° C. and a pressure of 200 Torr for 20 min by using HMDS gas 7. In this case, since the concentration of the hydroxyl groups was low in the upper portion of the exposed area 1a, the silylating reaction shown in FIG. 2B scarcely occurred. On the other hand, since the concentration of the hydroxyl groups was maintained at the initial state in the upper portion of the unexposed area 1b, the concentration of the hydroxyl groups was high. Therefore, the silylating reaction shown in FIG. 2B occurred in the upper portion of the unexposed area 1b to form a silylated layer 8 in the upper portion of the unexposed area 1b. In other words, there was selectivity in the silylating reaction.

Figure 1E:
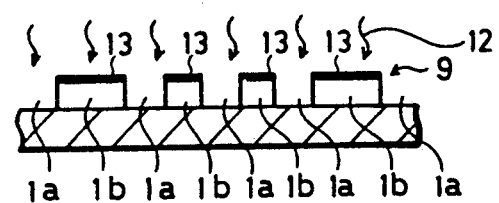

Then, as shown in FIG. 1E, the resist film 1 was developed by reactive ion etching using $O_2$ gas 12. In this case, silylated layer 8 was converted into an $SiO_2$ layer 13, to form an effective shielding material for the $O_2$ gas plasma. Accordingly, the not-silylated portion, i.e., exposed area 1a was selectively etched to remove. Namely, there was found a clear distinction between the exposed portion and unexposed portion. As a result, a resist pattern 9 of satisfactory high resolution power can be obtained.

In the above-mentioned embodiment, KrF excimer resin beam is used as the light for forming a pattern and since the KrF excimer beam 4 has a property of being strongly absorbed to the resist film, the sensitivity can be improved remarkably.

Figure 7:
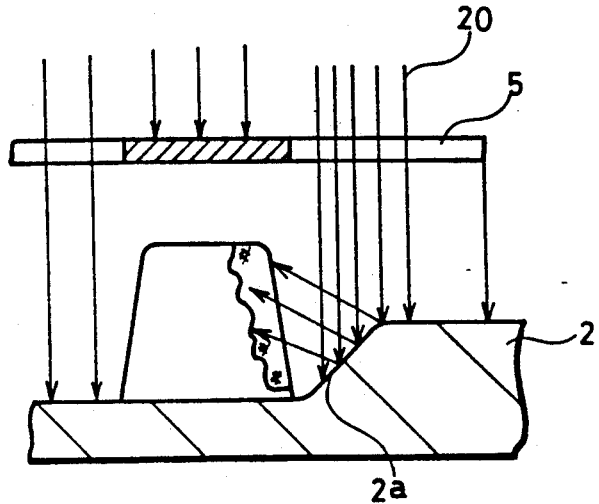
FIG. 7 shows an notching effect observed in the conventional method.
Figure 8A:
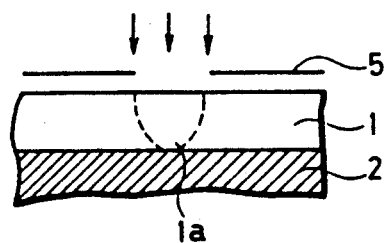
FIGS. 8A-8D are cross sectional views illustrating other conventional example of a resist pattern forming method.
Figure 8B:
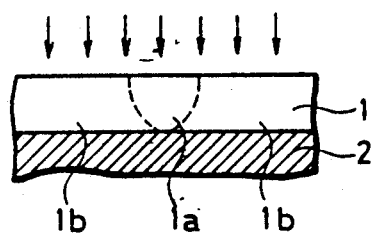
Figure 8C:
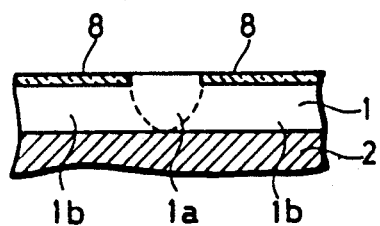
Figure 8D:
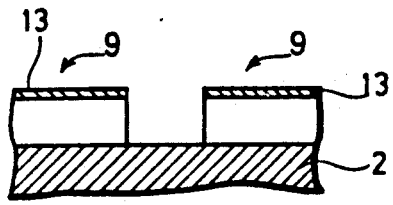

Further, since the KrF excimer beams has a property of being strongly absorbed to resist film 1, the crosslinking reaction occurs only at the surface portion layer of the resist film 1 and the laser beams does not reach as far as the lower portion of the resist film 1. Accordingly, if there is present any step in the substrate 2, notching phenomenon as shown in FIG. 7 does not occur. Likewise, if a light reflective film such as an Al film is present on the substrate 2, the pattern shape is free from the effect of the reflection.

In the above-mentioned example, although KrF excimer laser beam was used as Deep UV light, ArF excimer laser beam (at 193 nm wavelength) may also be used and, generally, light at a wavelength from 190 to 300 nm is preferred.

Further, in the above mentioned example, the temperature for the silylation was exemplified as 160° C. However, the invention is not restricted to such a temperature but a preferred result can be obtained within a temperature range from 80° to 200° C. If the temperature exceeds 200° C., silylating reaction proceeds also in the unexposed area to reduce the selectivity of the silylating reaction, failing to obtain satisfactory results. If the temperature is lower than 80° C., no silylating occurs.

Further, in the above-mentioned example, pressure for the silylation was exemplified as 200 Torr. However, the present invention is not restricted only to such a pressure but a preferred result can be obtained within a pressure range from 5 to 300 Torr. If the pressure exceeds 300 Torr, HMDS gas can no more be introduced. If the pressure is less than 5 Torr, the silylating reaction less occurs.

Further, in the above-mentioned example, silylating time was exemplified as 20 min. However, the present invention is not restricted only to such time but a preferred result can be obtained within a range of time from 10 to 20 min. If the time for the silylating reaction exceeds 120 min, silylating reaction occurs also in the exposed region to worsen the selectivity of the silylation. If the time is less than 10 min, no silylating reaction occurs.

Figure 3:
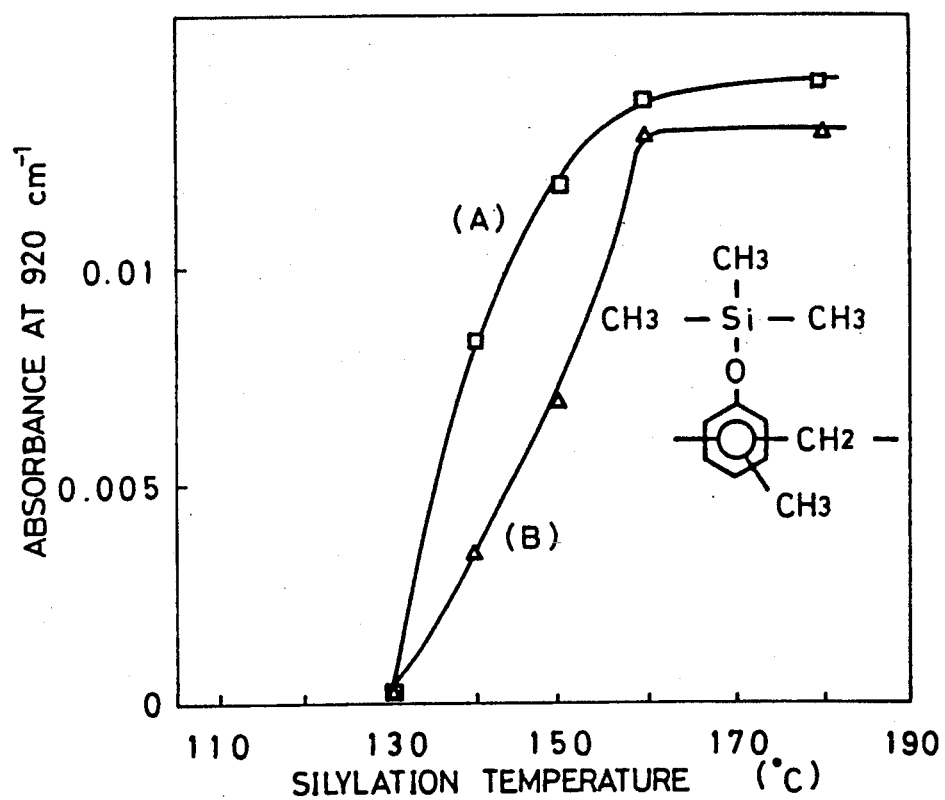
FIG. 3 is a graph for comparing the performance in the silylating reaction between p-vinylphenol/2-hydroxyl ethylmethacrylate and a novolak resin.

Furthermore, in the above mentioned example, p-vinylphenol/2-hydroxyethyl methacrylate copolymer was exemplified as a resin containing hydroxyl groups. However, the present invention is not restricted only thereto but may be a novolak resin or p-vinylphenol homopolymer. FIG. 3 compares the performance of p-vinylphenol/2-hydroxyethyl methacrylate copolymer and novolak resin in silylating reaction.

In the figure, the abscissa indicates silylating temperature while the ordinate indicates absorption by FT-IR at 920 cm$^{-1}$ (IR absorption belonging to Si—O bond). The time for the silylating reaction was 60 min. Curve (A) shows the case for the p-vinylphenol/2-hydroxyethyl methacrylate copolymer, while curve (B) shows the case for the novolak resin. As can be seen from the figure, the p-vinylphenol/2-hydroxyethyl methacrylate copolymer can be silylated at a lower silylating temperature than the novolak resin.

Further, although the p-vinylphenol/2-hydroxyethyl methacrylate copolymer was exemplified as the p-vinylphenol copolymer in the above-mentioned example, the present invention is not restricted only thereto but it may be p-vinylphenol/methyl methacrylate copolymer, p-vinylphenol/styrene copolymer or p-vinylphenol maleimide copolymer.

Further, although HMDS was exemplified as the silylating agent in the above-mentioned example, the present invention is not restricted only thereto but trimethyl silyldimethylamine, tetrachlorosilane or trimethylchlorosilane may also be used to attain similar effect to that in this example.

Furthermore, although p-vinylphenol/2-hydroxyethyl methacrylate was exemplified as the material for forming pattern in the above-mentioned example, it may also contain photosensitive material. A method shown in FIGS. 1A–1E (Example 1) and a conventional method shown in FIGS. 6A–6C (comparative example) are practiced by using MCPR2000H (trade name of products manufactured by Mitsubishi Kasei Co.) which is the naphthoquinone diazide-novolak type resin as the photoresist and using a KrF excimer laser beam as the light source. The results are collectively shown in Table 1.

TABLE 1

|  | Practical sensitivity (mJ/cm$^2$) | Practical resolution power (μmL/S) |
|---|---|---|
| Example 1 | 100–300 | 0.3 |
| Comparative Example 1 | 1000–4000 | 0.6 |

FIGS. 4A–4E are cross sectional views illustrating the steps of other example according to the present invention.

In the previous example, a special pattern forming material such as p-vinylphenol/2-hydroxyethyl methacrylate copolymer was used. However, this example has an advantageous effect capable of obtaining a satisfactory resist pattern of high resolution power by using a pattern forming a material and a production apparatus both of which are generally employed.

Figure 4A:
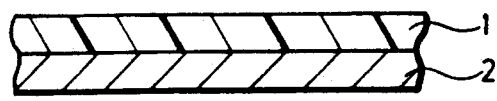
FIGS. 4A-4E are cross-sectional views illustrating the steps of other example of the present invention.

As shown in FIG. 4A, MCPR3000 (trade name of products manufactured by Mitsubishi Kasei Co.) which is a naphthoquinone diazide - novolak resin type resist was rotationally coated on a substrate 2. Then, it was pre-baked on a hot plate at 100° C. for 70 sec. to obtain a resist film 1 to 1.2 μm film thickness.

Figure 4B:
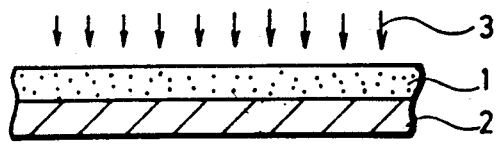

Subsequently, as shown in FIG. 4B, g-ray light (436 nm wavelength) 3 was applied to the entire surface of the resist film 1. The exposure amount was 400 mJ/cm$^2$. BY exposure of the g-ray light, naphthoquinone diazide in MCPR3000 was decomposed to form carboxyl group as shown below.

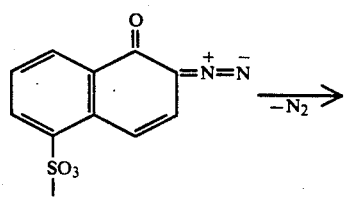

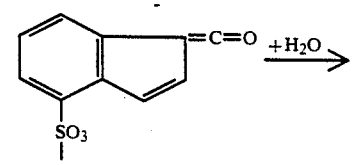

-continued

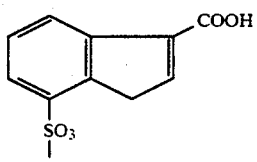

Figure 5:
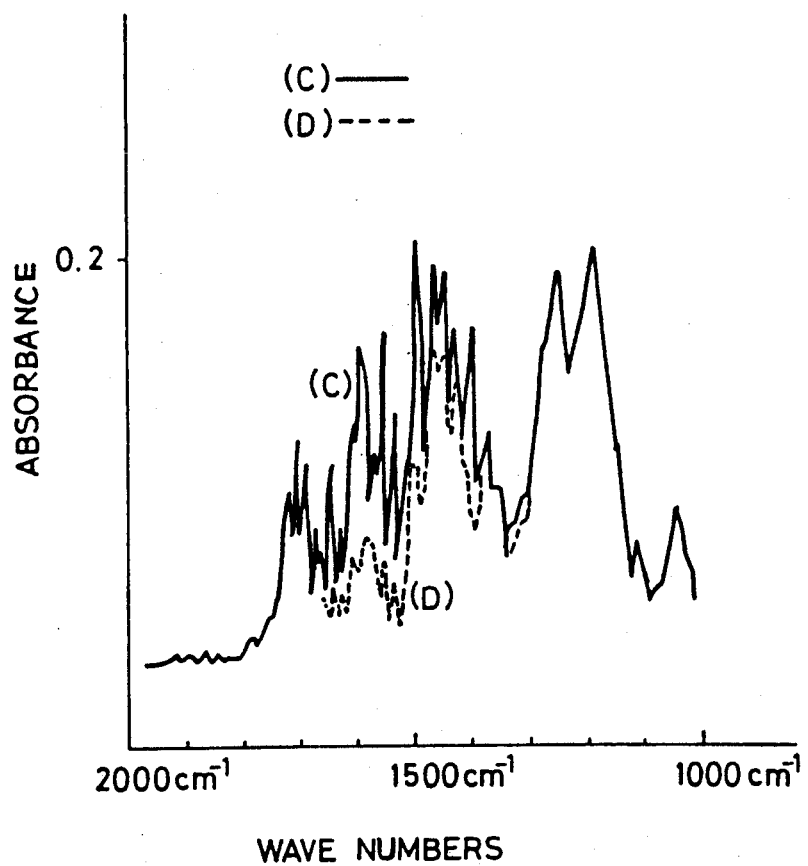
FIG. 5 is an FT-IR absorption spectrum chart for the resist film before and after exposure.

FIG. 5 is an FT-IR absorption spectrum of the resist film before and after exposure. Curve (C) is a spectrum chart for the unexposed resist and curve (D) is a spectrum chart for the resist after exposure. Absorption at 1550-1600 cm$^{-1}$ belongs to the diazide bond. As can be seen from FIG. 5, absorption at 1550-1600 cm$^{-1}$ is reduced after exposure, showing that the naphthoquinone diazide group is decomposed. The reason for previously decomposing the photosensitive agent is to be described later.

Figure 2A:
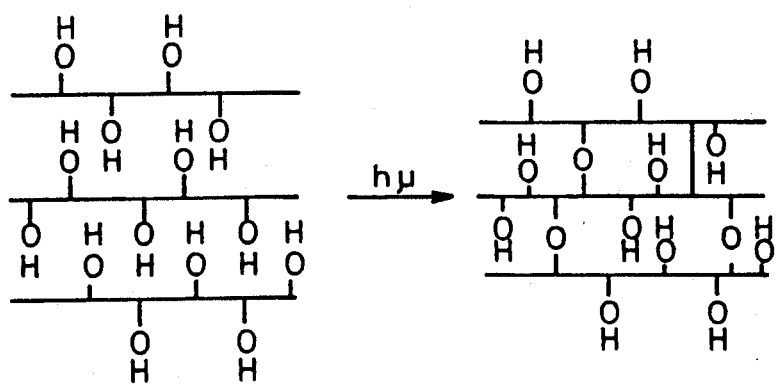
FIG. 2A shows a crosslinking reaction of a resin containing hydroxyl groups and FIG. 2B shows a silylating reaction.
Figure 4C:
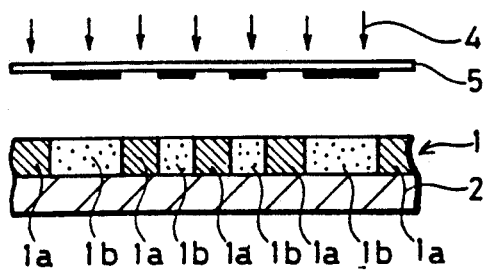

Then, as shown in FIG. 4C, KrF excimer laser beam 4 was selectively applied to the resist film by using a mask 5. By the selective exposure of the KrF excimer laser beam 4, the resist film 1 was partitioned into an exposed area 1a and an unexposed area 1b. In the exposed area 1a, crosslinking reaction of the resin occurred as shown in FIG. 2A. In this case, since the photosensitive agent was previously decomposed to form carboxyl groups as described above, the hydroxyl groups in the resin reacted together with the carboxyl groups. As a result, in the exposed area 1a, the crosslinking density was increased while the hydroxyl group density was further reduced. On the other hand, in the unexposed area 1b, the hydroxyl groups remained as they were and the carboxyl groups generated from the photosensitive agent also remained.

Figure 4D:
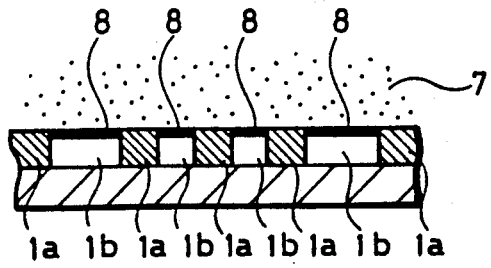

As shown in FIG. 4D, a substrate 2 having the resist film 1 in such a state was introduced into a vacuum oven and put to silylating reaction at a temperature of 120° C. under a pressure of 200 Torr for 30 min by using HMDS gas 7 By wetting the surface layer of the resist film 1 with the HMDS solution prior to the silylating reaction, as shown in FIG. 1C, the silylating reaction can be proceeded more efficiently.

Figure 2B:
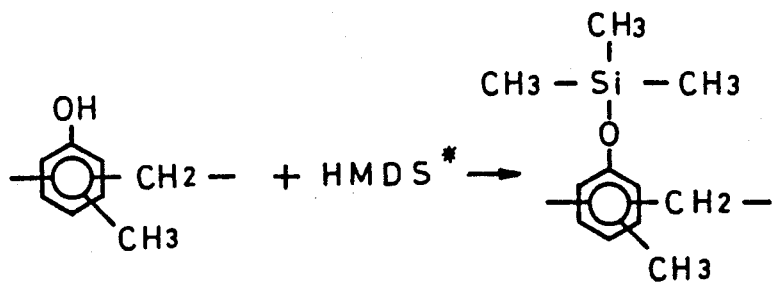
Figure 2B:
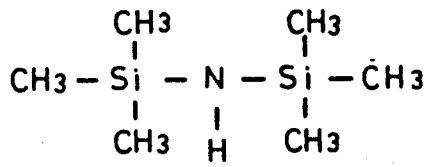

Now, in the step of the silylating reaction, since the concentration of the hydroxyl groups was low in the upper portion of the exposed area 1a, the silylating reaction shown in FIG. 2B scarcely occurred. On the other hand, since the hydroxyl groups and the carboxyl groups of the photosensitive agent remained unreacted as they were in the upper portion of the unexposed area 1b, their concentration was high. Accordingly, in the upper portion of the unexposed area 1b, the silylating reaction shown in FIG. 2B and the silylating reaction of the carboxyl groups of the photosensitive agent occurred to form a silylated layer 8. After all, the silylating reaction occurred preferentially in the upper portion of the unexposed area 1b. In other words, there was selectivity in the silylating reaction.

Figure 4E:
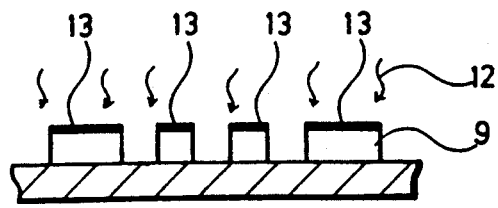

Then, as shown in FIG. 4E, the resist film 1 was developed by reactive ion etching using O$_2$ gas 12. The conditions for O$_2$ RIE were 600 W, 1 Pa and 10 sccm. In this case, the silylated layer 8 was converted into an SiO$_2$ film 13 to form an effective shielding material for O$_2$ gas plasma. Accordingly, the not-silylated portion, that is, the exposed area 1a was preferentially removed by etching. That is, there was found a clear distinction between the exposed area and the unexposed area. As a result, a resist pattern of satisfactory high resolution power could be obtained 9.

Figure 6A:
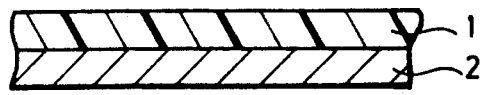
FIGS. 6A-6C are cross sectional views illustrating a conventional pattern forming method by using a novolak-naphthoquinone diazide type positive photoresist.
Figure 6B:
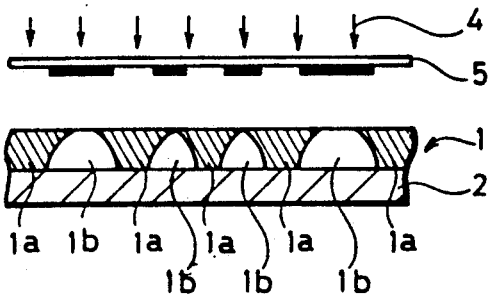
Figure 6C:

A method shown in FIGS. 4A-4E (Example 2) and a conventional method shown in FIGS. 6A-6C (Comparative Example 2) were practiced by using MCPR3000 (trade name of products manufactured by Mitsubishi Kasei Co.) as the resist and using a KrF excimer laser beam as the light source. The results are collectively shown in Table 2.

TABLE 2

| | Practical sensitivity (mJ/cm$^2$) | Practical resolution power (μmL/S) |
|---|---|---|
| Example 2 | 200-500 | 0.35 |
| Comparative Example 2 | 1000-2000 | 1.0 |

Since the KrF excimer laser beam is used as the light for forming the pattern and the KrF excimer laser beam has a property of being strongly absorbed to the resist, it can provide an advantageous effect of increasing sensitivity.

In the above-mentioned example, although the use of g-ray was exemplified as the light for decomposing the photosensitive agent, the present invention is not restricted only thereto but light having wavelength from 300 to 450 nm can be used preferably. Further, in the above-mentioned example, although the use of the KrF excimer laser was exemplified as light for forming a pattern, the present invention is not restricted only thereto but an ArF excimer laser beam may be used and light at a wavelength of 190 to 500 nm, particularly, 190 to 300 nm is generally preferred.

Further, in the above-mentioned example, although the use of the novolak resin was exemplified as the material for forming a pattern, p-vinylphenol polymer, polymethyl methacrylate or polyglycidyl methacrylate comprising carboxyl-containing monomer such as acrylic or methacrylic acid can attain the similar effect with that in the example.

Further, in the above-mentioned example, although the temperature for silylation was exemplified as 120° C., the present invention is not restricted only thereto but satisfactory result can be obtained within a temperature range from 80° to 160° C.

Further, in the above-mentioned example, although the use of 200 Torr of pressure for the silylation was exemplified, the present invention is not restricted only thereto but satisfactory result can be obtained within a pressure range from 5 to 200 Torr.

Further, in above-mentioned example, although 30 min of time was exemplified for silylation, the present invention is not restricted only thereto but satisfactory result can be obtained within a range from 30 to 120 min.

As has been explained above, according to the first aspect of the present invention, a pattern forming material comprising a hydroxyl group-containing resin is at first coated on a substrate, to which Deep UV light is selectively applied by using an optional mask. Subsequently, the surface of the unexposed area is selectively silylated by a silylating agent and then development is conducted by O$_2$ gas plasma. With such a constitution, there can be provided a clear distinction between the exposed area and the unexposed area to obtain a resist pattern of high resolution power.

In addition, Deep UV light is used as the pattern-forming light and the Deep UV light has a property of being strongly absorbed to the resist. Accordingly, it can provide an effect of increasing the sensitivity.

Further, since the Deep UV light has a property of being strongly absorbed to the resist, crosslinking reaction occurs only at the surface of the resist film and the light does not reach as far as the lower portion of the resist film. Accordingly, if any step is present in the substrate, no undesirable etching phenomenon is caused. Likewise, if any light reflective film such as an Al film is present on the substrate, the pattern shape is free from the effect of reflection.

According to the second aspect of the present invention, a pattern forming material comprising a desirable resin containing hydroxyl groups and/or carboxyl groups and a photosensitive agent forming carboxyl groups under exposure of light is at first coated on a substrate. Subsequently, light at a wavelength required for decomposing the photosensitive agent is exposed to the entire surface before exposure of the pattern-forming light to form carboxyl groups by the photosensitive agent. Then, the pattern forming light is selectively applied by using a mask. Then, the surface of the unexposed area is selectively silylated using a silylating agent and, thereafter, developed using O2 gas plasma. With such a constitution, there can be formed a clear distinction between the exposed area and unexposed area, to obtain a resist pattern of high resolution power.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A pattern forming method comprising the steps of:
    coating a pattern-forming material comprising a resin containing hydroxyl groups on a substrate to form a resin film containing hydroxyl groups on said substrate,
    selectively applying Deep UV light at a wavelength of 190 to 300 nm to said resin film containing hydroxyl groups by using a mask, thereby partitioning said resin film into an exposed area and an unexposed area,
    treating said resin film with a silylating agent for silylating the surface of the unexposed area of said resin film, said treating said resin film with a silylating agent being conducted at a temperature of 80° to 200° C. and a pressure of 5 to 300 Torr and for a time of 10 to 120 min., and
    developing said resin film by O2 gas plasma for selectively removing the exposed area of the resin film, wherein
    after said selective light application and prior to said silylating treatment, for improving the affinity between the resin film and the silylating agent, conducting a pretreatment step selected from the group consisting of the following steps:
    (a) wetting the surface of the resin film with a solution of said silylating agent, and
    (b) exposing the surface of the resin film to vapors of said silylating agent,
    wherein said pretreatment is carried out at a temperature of 80° to 100° C., for 60 to 120 seconds under atmospheric pressure.

2. A method as defined in claim 1, wherein the resin containing the hydroxyl groups comprises a resin selected from the group consisting of novolak resin and p-vinylphenol polymer.

3. A method as defined in claim 2, wherein the p-vinylphenol copolymer includes p-vinylphenol/methyl methacrylate copolymer, p-vinylphenol/styrene copolymer or p-vinylphenol/phenyl maleimide copolymer.

4. A method as defined in claim 1, wherein the Deep UV light includes KrF excimer laser beam or ArF excimer laser beam.

5. A method as defined in claim 1, wherein the silylating agent includes hexamthyl disilazane or trimethylsilyl dimethylamine.

6. A method as defined in claim 1, wherein the pattern forming material contains a photosensitive agent forming carboxyl groups under exposure of light.

7. A pattern forming method comprising the steps of:
    coating a pattern forming material comprising a resin which contains at least one group selected from the group consisting of hydroxyl groups and carboxyl groups and which is crosslinked by irradiation with light at a wavelength of 190-300 nm and a photosensitive material which decomposes to form carboxyl groups when exposed to light at a wavelength of 305-450 nm on a substrate to form a resin film of said pattern forming material on said substrate,
    applying a first light at a wavelength of 305 to 450 nm to the entire surface of said resin film to decompose said photosensitive material and form carboxyl groups,
    selectively applying a second light at a wavelength of 190-300 nm for crosslinking said resin film to said resin film by using a mask, thereby partitioning said resin film into an exposed area and an unexposed area by the second light,
    treating said resin film with a silylating agent for silylating the surface of the unexposed area by said second light, and
    developing said resin film with O2 gas plasma for selectively removing the exposed area by said second light.

8. A method as defined in claim 7, wherein the step of treating the resin film with the silylating agent is conducted under the conditions of a temperature from 80° to 160° C., a pressure from 5 to 200 Torr and for a time from 30 to 120 min.

9. A method as defined in claim 7, wherein the resin containing hydroxyl groups comprises a novolak resin or p-vinylphenol polymer.

10. A method as defined in claim 7, wherein the resin containing the carboxylic groups comprises polymethyl methacrylate or polyglycidyl methacrylate in which methacrylic acid is copolymerized.

11. A method as defined in claim 7, wherein the silylating agent comprises hexamethyl disilazane or trimethyl silyl dimethylamine.

* * * * *